United States Patent [19]
Cala et al.

[11] Patent Number: 5,558,109
[45] Date of Patent: Sep. 24, 1996

[54] AQUEOUS CLEANING METHOD AND COMPOSITION WITH NONIONIC SURFACTANTS FOR REMOVING WATER SOLUBLE FLUX

[75] Inventors: Francis R. Cala, Highland Park; Richard A. Reynolds, Plainsboro, both of N.J.

[73] Assignee: Church & Dwight Co., Inc., Princeton, N.J.

[21] Appl. No.: 391,015

[22] Filed: Feb. 21, 1995

[51] Int. Cl.$^6$ .................. B08B 3/02; B08B 3/08; C11D 1/825; C11D 1/83
[52] U.S. Cl. .................. 134/42; 134/2; 134/40; 510/175; 510/176
[58] Field of Search .................. 252/174.22, 156, 252/174.74, 174.24, 108, 109, DIG. 1, DIG. 2, DIG. 4, DIG. 14, 174.21, 174.23, 559; 134/40, 2, 42, 1, 10, 26

[56] References Cited

U.S. PATENT DOCUMENTS

| | | | |
|---|---|---|---|
| 3,870,647 | 3/1975 | Travers | 252/118 |
| 4,028,282 | 6/1977 | Okumura et al. | 252/537 |
| 4,048,121 | 9/1977 | Chang | 252/527 |
| 4,201,686 | 5/1980 | Augustijn | 252/174.22 |
| 4,233,171 | 11/1980 | McLaughlin et al. | 252/99 |
| 5,234,505 | 8/1993 | Winston et al. | 134/40 |
| 5,234,506 | 8/1993 | Winston et al. | 134/40 |
| 5,261,967 | 11/1993 | Winston et al. | 134/42 |
| 5,264,046 | 11/1993 | Winston et al. | 134/42 |
| 5,264,047 | 11/1993 | Winston et al. | 134/42 |
| 5,320,756 | 6/1994 | Winston et al. | 210/667 |
| 5,350,457 | 9/1994 | Kitazawa et al. | 134/40 X |
| 5,393,448 | 2/1995 | Winston et al. | 252/109 |
| 5,397,495 | 3/1995 | Winston et al. | 252/109 |
| 5,431,847 | 7/1995 | Winston et al. | 252/174.24 |
| 5,433,885 | 7/1995 | Winston et al. | 252/174.24 |

FOREIGN PATENT DOCUMENTS

| | | |
|---|---|---|
| 1272700 | 10/1989 | Japan . |
| 3131698 | 6/1991 | Japan . |
| 5098292 | 4/1993 | Japan . |

OTHER PUBLICATIONS

Cala, Frank, et al., "Effective Cleaning at Low Wash Temperatures", Surface Mount Technology, pp. 1–3.

*Primary Examiner*—Douglas J. McGinty
*Attorney, Agent, or Firm*—Irving M. Fishman

[57] ABSTRACT

A cleaning composition for removing water soluble flux residues from circuit assemblies comprises a surfactant formulation containing three nonionic surfactants which have cloud points which differ by at least 5° F. from each other so as to provide optimum cleaning performance over a broadened temperature range. The surfactant formulation is preferably in the form of an aqueous concentrate which further contains alkaline salts, a corrosion inhibitor, a carboxylated polymer stabilizer to maintain the corrosion inhibitor in solution and a hydrotrope to maintain the surfactants in solution.

50 Claims, No Drawings

AQUEOUS CLEANING METHOD AND COMPOSITION WITH NONIONIC SURFACTANTS FOR REMOVING WATER SOLUBLE FLUX

FIELD OF THE INVENTION

This invention relates to an aqueous cleaner useful in removing water soluble flux residues from circuit assemblies. The invention is also directed to a method of removing at reduced wash temperatures, aqueous-based flux residues as well as the white residue commonly associated with the manufacture of printed circuit boards, wherein water soluble flux or water soluble solder paste was used.

BACKGROUND OF THE INVENTION

The cleanliness of electronic circuit assemblies (ECA), such as printed circuit boards (PCB) or printed wiring boards (PWB), is generally regarded as being critical to their functional reliability. Ionic and nonionic contamination on circuit assemblies is believed to contribute to premature failures of the circuit assemblies by allowing short circuits to develop. In addition, white residues are aesthetically unappealing and, thus, are unappealing to both the assembler and their customers.

In the manufacture of electronic circuit assemblies, ionic and nonionic contamination can accumulate after one or more steps of the process. Circuit assembly materials are plated, etched, handled by operators in assembly, coated with corrosive or potentially corrosive fluxes and finally soldered.

In the fabrication of electronic circuit assemblies, e.g., printed circuit boards, soldering fluxes are first applied to the substrate board material to remove metal oxides from the surface being soldered to ensure firm, uniform bonding of the solder. These soldering fluxes fall into three broad categories: rosin and water soluble fluxes and no-clean. The rosin fluxes, which are generally only moderately corrosive and have a much longer history of use, are still widely used throughout the electronics industry. The water soluble fluxes, which are a more recent development, are being used increasingly in consumer products applications. Because water soluble fluxes contain strong acids and/or amine hydrohalides, such fluxes are very corrosive. Unfortunately, residues of any flux can cause circuit failure if residual traces of the material are not carefully removed following soldering and thus remain on an electronic circuit assembly.

The removal of rosin flux from printed circuit boards has traditionally been carried out with the use of chlorinated hydrocarbon solvents such as 1,1,1,-trichlorethane, trichloroethylene, trichloromonofluoromethane, methylene chloride, trichlorotrifluoroethane (CFC113), tetrachlorodifluoroethane (CFC112) or mixtures or azeotropes of these and/or other solvents. These solvents are undesirable, however, because they are toxic and when released into the environment are believed to deplete the ozone layer and/or contribute to the inventory of greenhouse gases. Thus, use of such solvents is subject to close scrutiny by the Occupational Safety and Health Administration (OSHA) and the Environmental Protection Agency (EPA), and stringent containment equipment must be used. Moreover, if released into the environment these solvents are not readily biodegradable and are thus hazardous for long periods of time.

The present assignee has developed an effective patented aqueous cleaner marketed under the tradename Armakleen™ to remove rosin flux.

However, in order to avoid the use of the chlorinated or hydrocarbon solvents generally employed to remove rosin flux residues subsequent to soldering printed circuit boards, there has been considerable increase in the employment of aqueous type solder fluxes which can be washed subsequent to the soldering operation by means of aqueous detergent solutions or pure water. It has been found, however, that when using water only or aqueous detergent cleaners to remove the aqueous-based solder flux residue, certain contaminants still remain which can result in an increased leakage current in the circuit devices. This problem is particularly acute when silicone type encapsulants are employed for encapsulating the integrated circuit devices. Such encapsulants are generally relevantly soft and have relatively low density and the contaminants become trapped within the encapsulant layer. These contaminants may then eventually migrate to the surface of the device itself resulting inasmuch as an order of magnitude higher leakage current as compared to a control circuit which has not undergone the solder and detergent cleaner procedure. Not only is this higher leakage current undesirable, but the reliability of the devices may be diminished. Similarly, the effectiveness of water and aqueous detergent systems is considerably lacking for cleaning low standoff chip carriers wherein the circuit devices are placed with only minute clearances from the boards as the contaminants become entrapped in the minute clearance space rendering it difficult for any cleaning solution to remove all the contamination.

It has also been found when removing the aqueous-based fluxes with water or detergent compositions and the like, a "white residue" often remains on the surface. The white residue was believed to be primarily the result of the soldering process when using an aqueous fluxing agent. Excessive preheat and soldering temperatures can cause oxidation and decomposition of organic acids used in water soluble fluxes. There are, however, many other possible sources of white residue. The white residue is objectionable, due not only to the appearance, but also the composition is unknown and this raises a concern that the residue may somehow be a corrosion product or be corrosive to the soldered joints. Attempts have been made over the years to remove the residue, all with limited or no success. For example, detergents and surfactants have variously been employed typically in hot water solutions.

U.S. Pat. No. 4,604,144 discloses a method of cleaning circuit boards to remove contaminants which remain subsequent to the detergent cleaning of aqueous-based flux residues on circuit boards. According to the patent, the boards are rinsed in a low molecular weight mono or dicarboxylic acid such as formic, acetic or oxalic acids followed by a thorough rinsing with deionized water to remove the acid. In a preferred embodiment, the organic acid aqueous rinse solution contains a certain amount of an alcohol such as methanol or a soluble freon type fluorocarbon solvent solution. Inasmuch as the use of aqueous-based fluxes were devised so as to eliminate the use of volatile solvents during cleaning of the flux residues, the need for additional alcohol or fluorocarbon solvents as disclosed in this patent is not very desirable.

U.S. Pat. No. 5,312,027 prevents the formation of white residue by exposing the circuit board to a dilute aqueous basic solution prior to a final water rinse. The aqueous basic solution typically comprises a base such as ammonia or sodium bicarbonate.

To clean the aqueous-based flux residues from the circuit board, hot water solutions with or without alkaline detergents and/or surfactants have been utilized. Typically, temperatures at or above 140° F. have been used to clean the water soluble fluxes. Such high temperatures are disadvantageous due to the higher energy costs which are involved relative to lower temperature washing and the difficulty with maintaining these high temperatures. Unfortunately, at lower temperatures, i.e., below 140° F., the desired removal of the aqueous-based flux and other contaminants such as white residues has been even more difficult to achieve.

Accordingly, there is a need to provide a cleaning composition and method which removes not only the aqueous-based soldering flux contaminants but, also other contaminants such as white residue which tend to be left on the integrated circuit devices when employing prior art aqueous detergent cleaning compositions. Additionally, there are distinct advantages to accomplishing this at recovered wash temperatures, i.e., below 140° F.).

There is also a need to provide adequate cleaning of water soluble fluxes and other contaminants from the circuit assemblies using aqueous-based compositions which do not contain volatile components and which are effective at relatively low temperature.

It would also be desirable to provide an aqueous-based cleaner for removing water soluble flux residues and other contaminants from integrated circuit assemblies which are useful at lower temperature and effective to remove any type of water soluble flux. It would be particularly beneficial to remove residues from under components with low standoff heights.

Accordingly, the objectives of the present invention are to provide a cleaning composition for removing aqueous-based fluxes from circuit assemblies which will meet the unmet needs described above. Other objects of the invention will become readily apparent upon a review of the description of the invention and preferred embodiments which are set forth below.

SUMMARY OF THE INVENTION

The present invention is directed to a cleaning composition useful for removing aqueous-based flux and which comprises a surfactant formulation having a uniquely tailored surfactant profile which provides optimum cleaning over a wide temperature range. More particularly, the surfactant formulation contains at least three nonionic surfactants which have cloud points that are staggered to give optimum cleaning over a broadened temperature range. It is generally known that nonionic surfactants provide optimum cleaning performance at a temperature that is just below or approaching the cloud point of the surfactant. Normally, however, surfactants chosen for use in cleaning compositions are correlated for maximum performance at a particular temperature of use and not for consistently high performance over a temperature range. As circuit assemblies can be fabricated with a wide variety of fluxes, can have widely differing purposes and components, and can be cleaned with a variety of cleaning equipment, cleaning compositions tailored to a particular use temperature may not be very effective, as the user often has to adjust the cleaning temperature to accommodate the various factors mentioned immediately above. The present invention optimizes the use of the relationship between surfactant cloud point and optimum cleaning performance by including in the formulation surfactants with staggered cloud points in order to be effective over a broader temperature range. This technique is particularly beneficial at reduced washing temperatures where there is normally a reduction in cleaning versus that obtained at higher target temperatures. Previous to this invention, it is not believed that cloud point has been used in such a manner to provide optimum cleaning performance.

The cleaner of the present invention is preferably provided in the form of an aqueous concentrate which is further diluted with water for use. The aqueous concentrate contains at least three nonionic surfactants which have differing cloud points to be effective over a temperature range extending at least 20° F. The nonionic surfactants have cloud points which are staggered so as to be at least 5° F. different from each other.

The concentrate of the present invention can best be formulated for use upon dilution at a temperature range of from 90° 150° F. and which contains three nonionic surfactants having staggered cloud points as just previously described and further so as to be most effective throughout the range so the diluted concentrate can be widely used. The diluted concentrate of this invention is particularly useful at temperatures below 135° F. In use, the aqueous cleaning concentrate of the present invention is diluted in water, typically to 10% dilution and directed upon the circuit assemblies containing the water soluble flux and other water soluble contaminants for removal of the contaminants from the circuit assemblies.

The aqueous cleaning concentrate of this invention useful for removing water soluble fluxes from circuit assemblies, also can include other adjuvants such as alkalinity providing agents to neutralize the water soluble flux residues, corrosion inhibitors to prevent corrosion of metal components on the circuit assemblies, hydrotropes to maintain the surfactants in solution, defoaming agents as well as anionic surfactants which are useful over a wide temperature range.

DETAILED DESCRIPTION OF THE INVENTION

The cleaning composition of the present invention is capable of removing any type of water soluble flux from circuit assemblies. Thus, water soluble fluxes such as organic acids including lactic, citric, oleic, stearic and gluconic acids; organic hypohalides such as aniline hypochloride, glutamic acid hypochloride, dimethyl ammonium chloride; amines such as urea and triethanolamine; and amides; and the like. Besides the water soluble fluxes, the cleaning composition of the present invention in aqueous solution is believed capable of removing other contaminants which are present on circuit assemblies including but not limited to photoresist, solder masks, adhesives, machine oils, greases, silicones, lanolin, mold release agents, polyglycols and plasticizers and the like.

The cleaning composition of the present invention includes a surfactant formulation which contains at least three nonionic surfactants which have differing cloud points to be highly effective for cleaning over a broad temperature range. In general, the nonionic surfactants will have cloud points at least 5° F. different from each other. It is important to recognize that the cloud point of a surfactant as stated herein is the cloud point of the surfactant in an aqueous solution of the cleaning composition of the present invention. Thus, a listed cloud point for a surfactant in water may be slightly different than the cloud point of the same surfactant in the aqueous concentrate of the present invention since other components such as alkalinity providing agents and other active ingredients are present. The cloud point of the surfactant as defined herein is the particular temperature upon heating at which there is a sudden onset of turbidity within the aqueous solution as a result of surfactant separation.

More specifically, the nonionic surfactants which form the surfactant formulation of the present invention will have cloud points ranging from about 5° to about 25° F. from each other and, more preferably, from about a 10° to 20° F. difference from the cloud points of each other. Accordingly, the cleaning solution which contains the surfactant formulation is optimally effective over a wider temperature range than previous detergent compositions which were typically formulated with one or two surfactants chosen to be particularly effective at a particular temperature or very narrow temperature range. It is to be understood that additional nonionic surfactants can be included in the composition having a cloud point so as to further broaden the temperature range at which the composition is most effective. Similarly, other nonionic surfactants which have cloud points in between the cloud points of the three surfactants of the formulation can also be included although it is not believed that such surfactants particularly add to the efficacy of the cleaning composition of this invention and may simply provide undesirable additional organic materials which add to the biological oxygen demand (BOD) and chemical oxygen demand (COD) of the composition and aqueous solution formed therefrom.

The nonionic surfactants which can be utilized in accordance with the present invention include any nonionic surfactant which is available so long as the three surfactants utilized in the formulation have cloud points which are staggered by at least 5° F. from each other. In general, nonionic surfactants such as ethoxylated alcohols, ethylene oxide-propylene oxide block copolymers, ethoxylated-propoxylated alcohols, alcohol alkoxylate phosphate esters, ethoxylated amines and alkoxylated thioethers are believed to be useful surfactants in the surfactant formulation of the cleaning composition of the present invention.

More specific examples of nonionic surfactants include ethoxylated thiol surfactants as described for example in U.S. Pat. Nos. 4,575,569 and 4,931,205, the contents of both of which are herein incorporated by reference. A particularly useful commercial product is an ethoxylated dodecylmercaptan with about 6 ethylene oxide units which is a commercial product known as Alcodet 260™ marketed by Rhone-Poulenc.

Examples of other nonionic surfactants include compounds formed by condensing ethylene oxide with a hydrophobic base formed by the condensation of propylene oxide with propylene glycol. The hydrophobic portion of the molecule which exhibits water insolubility has a molecular weight from 1,500 to 1,800. The addition of polyoxyethylene radicals to this hydrophobic portion tends to increase the water solubility of the molecule as a whole in a liquid and the liquid character of the product is retained up to the point where the polyoxyethylene content is about 50% of the total weight of the condensation product. Examples of compositions are the "Pluronics" sold by BASF.

Other suitable surfactants include those derived from the condensation of ethylene oxide with the product resulting from the reaction of propylene oxide and ethylene-diamine or from the product of the reaction of a fatty acid with sugar, starch or cellulose. For example, compounds containing from about 40% to 80% polyoxyethylene by weight having a molecular weight from about 5,000 to 11,000 resulting from the reaction of ethylene oxide groups with a hydrophobic base constituted of the reaction product of ethylene diamine and excess propylene oxide, and hydrophobic basis having a molecular weight of the order of 25,000 to 3,000 are satisfactory.

In addition, the condensation product of aliphatic alcohols having from 8 to 18 carbon atoms, in either straight chain or branched chain configuration, with ethylene oxide and propylene oxide may also be employed. Examples of such surfactants are those of the "Plurafac" series, also sold by BASF.

Other useful surfactants include alkoxylated alcohols which are sold under the tradename of "Polytergent SL-Series" surfactants by Olin Corporation or "Neodol" by Shell Chemical Co.

Polyoxyethylene condensates of sorbitan fatty acids, alkanol amides, such as the monoalkanolamides, dialkanolamides, and amines; and alcohol alkoxylated phosphate esters, such as the "Klearfac" series from BASF are also useful surfactants in the compositions of this invention.

The polyethylene oxide/polypropylene oxide condensates of alkylphenols can also be used, but such surfactants are not effectively biodegradable and, in most cases, should be avoided.

Another useful surfactant are those derived from N-alkylpyrrolidone. Particularly useful is N-(n-alkyl)-2-pyrrolidone in which the alkyl group contains 6–15 carbon atoms. These compounds are described in U.S. Pat. No. 5,093,031 which is incorporated herein by reference.

Preferably, the cleaning composition of the present invention is useful at temperatures ranging from about 90°–150° F., more preferably, between 90° and under 135° F. and, most preferably, between 100° and 130° F. With respect to these preferred temperature ranges to remove the aqueous flux from circuit assemblies, the surfactant formulation will comprise a first surfactant having a cloud point which falls within the range of about 95°–120° F., a second surfactant having a cloud point which falls within the range of about 110°–135° F. and third surfactant having a cloud point which falls within the range of about 125°–150° F. The surfactants have cloud points which are staggered such that the second and third surfactants have a cloud point at least 5° F. higher than the cloud points of the first and second surfactant, respectively. Again, it is to be understood that the cloud points are those in the aqueous solution which is used or, in other words, in the diluted aqueous concentrate. It is not believed that the concentration of the composition in water has a large effect on cloud point.

The cleaning composition of the present invention preferably includes other active adjuvants to enhance cleaning. Among such adjuvants are alkalinity providing agents which are particularly useful for neutralizing the aqueous-based fluxes, in particular, the acid fluxes. Useful alkalinity providing agents can be provided by one or more alkaline salts. Preferred salts are those of potassium and sodium and, especially preferred are the potassium and sodium carbonates and bicarbonates which are economical, safe and environmentally friendly. The carbonate salts include potassium carbonate, potassium carbonate dihydrate, potassium carbonate trihydrate, sodium carbonate, sodium carbonate decahydrate, sodium carbonate heptahydrate, sodium carbonate monohydrate, sodium sesquicarbonate and the double salts and mixtures thereof. The bicarbonate salts include potassium bicarbonate and sodium bicarbonate and mixtures thereof. Mixtures of the carbonate and bicarbonate salts are also especially useful.

Although not preferred, other suitable alkaline salts can be used including the alkali metal ortho and complex phosphates. Examples of alkali metal orthophosphates include trisodium or tripotassium orthophosphate. The complex phosphates are especially effective because of their ability to chelate water hardness and heavy metal ions. The complex phosphates include, for example, sodium or potassium pyrophosphate, tripolyphosphate and hexametaphosphates. It is preferred, however, to limit the amount of phosphates contained in the cleaners of this invention to less than 1 wt.% (phosphorus) relative to the total alkaline salt used inasmuch as the phosphates are ecologically undesirable being a major cause of eutrophication of surface water. Additional suitable alkaline salts for use in the cleaning composition of this invention include the alkali metal borates, silicates, acetates, citrates, tartrates, secsonates, edates, etc.

The pH of the cleaning composition in aqueous concentrate form can range from about 7 to 12.0. With the addition of the alkaline salts a basic pH range of 8.5 to 9.5 is most preferred.

The cleaning composition of the present invention also preferably includes other adjuvants such as corrosion inhibitors, polymeric stabilizing agents, anionic surfactants and hydrotropes to maintain the active ingredients of the composition stable in the aqueous solution.

Particularly useful corrosion inhibitors which can be added to the aqueous metal cleaning composition of this invention include magnesium ions. Preferably, the magnesium ions are provided in water soluble form. Examples of useful water soluble forms of magnesium ions are the water soluble salts thereof including the chlorides, nitrates and sulfates. Particularly preferred is magnesium sulfate which can be readily stabilized in aqueous solution at the lower pH range which characterizes the aqueous concentrates of the present invention. If the alkalinity providing agents, are the alkali metal carbonates, bicarbonates or mixtures of such agents, magnesium oxide can be used to provide the magnesium ion although magnesium oxide is not preferred since it is more difficult to stabilize the magnesium oxide relative to the stabilization of the magnesium sulfate. Other corrosion inhibitors can be utilized including alkali metal silicates although, again, such material is not preferred as it is difficult to stabilize the alkali metal silicate in solution at lower pH ranges.

In order to maintain the solubility of the magnesium ion corrosion inhibitors in aqueous solution, in particular, under the mildly alkaline pH conditions of the concentrate of this invention and in the presence of agents which would otherwise cause precipitation of the magnesium ions, e.g., carbonates, phosphates, etc. It has been found advantageous to include a carboxylated polymer to the solution.

The carboxylated polymers may be generically categorized as water-soluble carboxylic acid polymers such as polyacrylic or polymethacrylic acids or vinyl addition polymers. Of the vinyl addition polymers contemplated, maleic anhydride copolymers as with vinyl acetate, styrene, ethylene, isobutylene, acrylic acid and vinyl ethers are examples.

All of the above-described polymers are water-soluble or at least colloidally dispersible in water. The molecular weight of these polymers may vary over a broad range although it is preferred to use polymers having average molecular weights ranging between 1,000 up to 1,000,000. In a preferred embodiment of the invention these polymers have a molecular weight of 100,000 or less and, most preferably, between 1,000 and 10,000.

The water-soluble polymers of the type described above are often in the form of copolymers which are contemplated as being useful in the practice of this invention provided they contain at least 10% by weight of

groups where M is hydrogen, alkali metal, ammonium or other water-solubilizing radicals. The polymers or copolymers may be prepared by either addition or hydrolytic techniques. Thus, maleic anhydrided copolymers are prepared by the addition polymerization of maleic anhydride and another comonomer such as styrene. The low molecular weight acrylic acid polymers may be prepared by addition polymerization of acrylic acid or its salts either with itself or other vinyl comonomers. Alternatively, such polymers may be prepared by the alkaline hydrolysis of low molecular weight acrylonitrile homopolymers or copolymers. For such a preparative technique see Newman U.S. Pat. No. 3,419,502.

Especially useful maleic anhydride polymers are selected from the group consisting of homopolymers of maleic anhydride, and copolymers of maleic anhydride with vinyl acetate, styrene, ethylene, isobutylene, acrylic acid and vinyl ethers. These polymers can be easily prepared according to standard methods of polymerization.

The carboxylated polymers aid in maintaining the magnesium compounds in solution, thereby preventing the precipitation of the corrosion inhibitor from solution and consequent degradation of corrosion protection. Further, the carboxylated polymer aids in preventing water-hardness precipitation and scaling on the cleaning equipment surfaces when the cleaning compositions of this invention are used in hard water.

To insure the solubility of the surfactants in aqueous solution, it is preferred to include a hydrotrope in the aqueous concentrate. The hydrotropes useful in this invention include the sodium, potassium, ammonium and alkanol ammonium salts of xylene, toluene, ethylbenzoate, isopropylbenzene, naphthalene, alkyl naphthalene sulfonates, phosphate esters of alkoxylated alkyl phenols, phosphate esters of alkoxylated alcohols and sodium, potassium and ammonium salts of the alkyl sarcosinates. The hydrotropes are useful in maintaining the organic materials including the surfactant readily dispersed in the aqueous cleaning solution and, in particular, in an aqueous concentrate which is an especially preferred form of packaging the compositions of the invention and allow the user of the compositions to accurately provide the desired amount of cleaning composition into the aqueous wash solution. A particularly preferred hydrotrope is one that does not foam. Among the most useful of such hydrotropes are those which comprise the alkali metal salts of intermediate chain length linear monocarboxylic fatty acids, i.e., $C_7$–$C_{13}$. Particularly preferred are the alkali metal octanoates and nonanoates.

Another adjuvant which can be added to the cleaning composition of the present invention includes anionic surfactants which are effective over a wide temperature range and do not cloud out as characterizes the nonionic surfactants. A particularly useful anionic surfactant is the polycarboxylated ethylene oxide condensates of fatty alcohols such as manufactured by Olin under the tradename of "Polytergent CS-1". A nonionic defoamer can also be added advantageously to the composition of the present invention. Typically, the defoamers are equivalent to the nonionic surfactants described above and include, for example, nonionic alkoxylated alcohols including fatty alcohols.

The cleaning compositions of the present invention are most preferably provided as aqueous concentrates. Preferably, the concentrates are dilute aqueous solutions containing 1–20 wt.% active ingredients and 80–99 wt.% water. More preferably, the aqueous concentrate of the present invention contains 4–10 wt.% active ingredients including surfactants, alkalinity providing agents, corrosion inhibitors, stabilizers, defoamers, etc. as described above and 90–96 wt.% water.

Preferably, the nonionic surfactants will comprise from about 0.2 wt.%, more preferably, from about 0.4 to 1.5 wt.% relative to the concentrate. Although, the nonionic surfactants can be provided in equal amounts by weight, deviations from the use of equal amounts is well within the scope of the present invention.

The alkalinity providing agents including the alkaline salts described above are preferably included in the aqueous concentrate in amounts ranging from 1–15 wt.%, more preferably, from about 1 to 3 wt.% based on the concentrate. Reduced amounts of the alkaline salts provides an increase in ionic cleaning performance and allows easier closed looping of waste water. The corrosion inhibitor is provided in amounts ranging from 0.2–0.6 wt.%, the carboxylated polymeric stabilizer in amounts of 0.1–0.4 wt.%, the hydrotrope in amounts ranging from 1.25–4.5%, the anionic surfactant in minute amounts typically ranging from 0.025–0.5 wt.% and the defoaming agent typically present in amounts ranging from about 0.4–1% by weight, all based on the weight of the aqueous concentrate.

The aqueous cleaning concentrate of the present invention is typically employed in the cleaning procedures described herein at a dilution in water of 10% by volume (10×). Obviously, smaller or higher dilution rates are also within the scope of the present invention and most likely will range from dilutions of 5× to 20× based on the dilution of the concentrate. Deionized water is preferably used to form the concentrate and for diluting the concentrate and washing the circuit assemblies.

The cleaning composition of this invention can be used to clean any type of circuit assembly which contains water-soluble flux or water soluble paste which must be removed. Accordingly, the type of assembly structure to be cleaned is not believed to be critical to the invention. The assembly can be through hole, surface mount, or mixed technology.

The assembly manufacturing process for through hole components involves the placement of components such as integrated circuits, resistors, capacitors, diodes, etc. on the surface of a board or their insertion through pre-drilled holes. The components are then secured by soldering by mechanical or automatic means. Interspersed with the soldering operations are cleaning procedures and inspections to ensure that tape and solder flux residues than could lead to premature circuit failure do not remain.

For the removal of soldering flux deposits and other residues during printed circuit/wiring board fabrication, the compositions of the invention may be applied to the boards by immersion in dip tanks or by hand or mechanical brushing.

Alternatively, they may be applied by any of the commercially available printed wiring board cleaning equipment. Dishwasher size units may be employed, or much larger in-line conveyorized cleaning systems such as the various "Hydro-Station" models produced by Electrovert, Grand Prairie, Tex., can be used.

Depending upon their design, these washers may apply the flux removing compositions of the invention by spraying with mechanical nozzles or by rolling contact with wetted roller surfaces or by ultrasonic immersion. The temperature at which the compositions may be applied can range from room, or ambient, temperature (about 70° F.) to about 150° F., preferably, from about 90° to 130° F. The flux removing compositions or concentrates are diluted with water as above stated. Once solder flux has been loosened and removed during a period of contact which typically ranges from about 1 to about 5 minutes, but may be longer up to about 10 minutes, the boards are taken from the flux removing solution. Herein, the boards may simply be flushed with water for a period of up to about 2 minutes. Deionized water is preferred. The optimal rinsing time varies according to the kinds of surfactants and the concentrations of the flux removing solutions used and can easily be determined by routine experimentation.

The cleaned boards are then dried, preferably with forced air. Drying is expedited if the air is warmed, preferably to above about 100° F.

EXAMPLE 1

The following aqueous concentrate was prepared for use in removing water soluble fluxes. The ingredients and cloud points of the nonionic surfactants are set forth in Table 1 below.

TABLE 1

| Ingredient | Wt. % | Cloud point |
|---|---|---|
| Water | 94.21 | |
| Potassium Bicarbonate | 1.00 | |
| Potassium Carbonate | 0.40 | |
| Acrylic acid copolymer[1] | 0.20 | |
| Mag. Sulfate Heptahydrate | 0.34 | |
| Monatrope 1250[2] | 2.75 | |
| Olin CS-1[3] | 0.05 | |
| Olin S505LF[4] | 0.15 | 105° F. |
| Olin SL62[4] | 0.25 | 135° F. |
| BASF RA20[4] | 0.15 | 120° F. |
| BASF DW5[5] | 0.50 | |

[1] A polycarboxylated copolymer containing acrylic and maleic acid units and having a molecular weight of about 4,500, Rhone Poulenc.
[2] Sodium isononanoate
[3] Polycarboxylated ethylene oxide condensate of fatty alcohol (anionic surfactant)
[4] Alkoxylated linear alcohol (nonionic surfactant)
[5] Defoamer (nonionic)

EXAMPLE 2

In this Example, the cleaning ability of the cleaner of the present invention as exemplified by the formulation set forth in Table 1 above was compared with the cleaning ability of water only relative to the removal of water soluble paste (Kester 850WS) from two types of circuit assemblies which have different stand-off heights. The types of assemblies are described below.

ASSEMBLIES

IPCLCC=Institute for Interconnecting and Packaging Electronic Circuits Leadless Chip Carrier 1–5 mil standoff height PLCC68=Plastic Leaded Chip Carrier (68 leads) 50 mil standoff height The circuit assemblies were washed with either water or the aqueous concentrate of Table 1 which was diluted 10×. Wash times of 5 min. (Table 2) or 2 min. (Table 3) with a wash temperature of 100° F. were used. The cleaned boards were then tested (Test 1) with an omegameter to determine the amount of ionic contamination remaining on the assemblies. The operation of the omegameter is described below. Subsequent to measurement, the chips on the board were removed and the board and chips again tested (Test 2) by the omegameter to determine the amount of ionic contamination which remained on the board underneath the chips and on the chips themselves. Tables 2 and 3 set forth the amount of contamination which remained on the boards subsequent to cleaning. Table 4 shows the results of water wash only at a 5 min. wash time but at temperatures of 100° F. and 145° F.

Omegameter

Model: Alpha 600 SMD
Extraction Solution: 75% isopropanol
Method of Operation:

The omegameter works by taking a known volume of 75% isopropanol at a given clean resistivity (60.35 megohms), and a known surface area for the circuit boards being tested.

The boards were bathed in a recirculating, hot bath of the aforementioned alcohol solution for a given period of time. As the boards were washed in the alcohol, ionic material was removed and placed in solution which resulted in a drop in the resistivity (an increase in conductivity) of the surrounding alcohol solution.

A calculation was made by using the surface area of the boards, the volume of solution, and the drop in resistivity to determine a number which was measured in standard units of micrograms of NaCl per square inch.

TABLE 2

| Board Set # | Component | Cleaner | Wash Time min | Test 1 | Test 2 | Total |
|---|---|---|---|---|---|---|
| | | | | \multicolumn{3}{c}{Contamination µgNaCl/in²} | | |
| 1 | IPCLLC | Water | 5 | 5.9 | 2.5 | 8.4 |
| 2 | IPCLLC | Water | 5 | 3.0 | 1.4 | 4.4 |
| 3 | IPCLLC | Water | 5 | 4.0 | 0.5 | 4.5 |
| 4 | IPCLLC | Water | 5 | 2.5 | 1.4 | 3.9 |
| 5 | IPCLLC | Water | 5 | 1.4 | 0.0 | 1.4 |
| Avg Water | IPCLLC | Water | 5 | 3.4 | 1.2 | 4.5 |
| 6 | IPCLLC | Ex. 1 | 5 | 0.0 | 0.0 | 0.0 |
| 7 | IPCLLC | Ex. 1 | 5 | 0.9 | 0.0 | 0.9 |
| 8 | IPCLLC | Ex. 1 | 5 | 0.0 | 0.0 | 0.0 |
| 9 | IPCLLC | Ex. 1 | 5 | 0.5 | 0.8 | 1.3 |
| 10 | IPCLLC | Ex. 1 | 5 | 0.0 | 0.0 | 0.0 |
| Avg Ex. 1 | IPCLLC | Ex. 1 | 5 | 0.3 | 0.2 | 0.4 |
| 11 | PLCC68 | Water | 5 | 0.8 | 0.8 | 1.6 |
| 12 | PLCC68 | Water | 5 | 3.2 | 1.5 | 4.7 |
| 13 | PLCC68 | Water | 5 | 0.0 | 2.0 | 2.0 |
| 14 | PLCC68 | Water | 5 | 1.2 | 3.4 | 4.6 |
| 15 | PLCC68 | Water | 5 | 2.5 | 0.0 | 2.5 |
| Avg Water | PLCC68 | Water | 5 | 1.5 | 1.5 | 3.1 |
| 16 | PLCC68 | Ex. 1 | 5 | 0.0 | 0.0 | 0.0 |
| 17 | PLCC68 | Ex. 1 | 5 | 0.0 | 0.0 | 0.0 |
| 18 | PLCC68 | Ex. 1 | 5 | 0.0 | 0.0 | 0.0 |
| 19 | PLCC68 | EX. 1 | 5 | 0.0 | 0.0 | 0.0 |
| 20 | PLCC68 | Ex. 1 | 5 | 0.0 | 0.0 | 0.0 |
| Avg Ex. 1 | PLCC68 | Ex. 1 | 5 | 0.0 | 0.0 | 0.0 |

TABLE 3

| Board Set # | Component | Cleaner | Wash Time min | Test 1 | Test 2 | Total |
|---|---|---|---|---|---|---|
| | | | | \multicolumn{3}{c}{Contamination µgNaCl/in²} | | |
| 1 | IPCLLC | Water | 2 | 5.4 | 2.0 | 7.4 |
| 2 | IPCLLC | Water | 2 | 5.5 | 1.3 | 6.8 |
| 3 | IPCLLC | Water | 2 | 5.4 | 0.0 | 5.4 |
| 4 | IPCLLC | Water | 2 | 3.9 | 2.0 | 5.9 |
| 5 | IPCLLC | Water | 2 | 2.4 | 0.0 | 2.4 |
| Avg Water | IPCLLC | Water | 2 | 4.5 | 1.1 | 5.6 |
| 6 | IPCLLC | Ex. 1 | 2 | 0.9 | 0.0 | 0.9 |
| 7 | IPCLLC | Ex. 1 | 2 | 1.4 | 0.0 | 1.4 |
| 8 | IPCLLC | Ex. 1 | 2 | 0.0 | 0.0 | 0.0 |
| 9 | IPCLLC | Ex. 1 | 2 | 0.4 | 0.0 | 0.4 |
| 10 | IPCLLC | Ex. 1 | 2 | 0.0 | 0.0 | 0.0 |
| Avg Ex. 1 | IPCLLC | Ex. 1 | 2 | 0.5 | 0.0 | 0.5 |
| 11 | PLCC68 | Water | 2 | 2.0 | 0.0 | 2.0 |
| 12 | PLCC68 | Water | 2 | 3.2 | 3.4 | 6.6 |
| 13 | PLCC68 | Water | 2 | 1.0 | 2.7 | 3.7 |
| 14 | PLCC68 | Water | 2 | 2.5 | 0.0 | 2.5 |
| 15 | PLCC68 | Water | 2 | 1.2 | 3.4 | 4.6 |
| Avg Water | PLCC68 | Water | 2 | 2.0 | 1.9 | 3.9 |
| 16 | PLCC68 | Ex. 1 | 2 | 0.0 | 0.0 | 0.0 |
| 17 | PLCC68 | Ex. 1 | 2 | 0.0 | 0.0 | 0.0 |
| 18 | PLCC68 | Ex. 1 | 2 | 0.0 | 0.0 | 0.0 |
| 19 | PLCC68 | EX. 1 | 2 | 0.0 | 0.0 | 0.0 |
| 20 | PLCC68 | Ex. 1 | 2 | 0.0 | 0.0 | 0.0 |
| Avg Ex. 1 | PLCC68 | Ex. 1 | 2 | 0.0 | 0.0 | 0.0 |

TABLE 4

| Board Set # | Component | Cleaner | Wash Time min | Test 1 | Test 2 | Total |
|---|---|---|---|---|---|---|
| | | | | \multicolumn{3}{c}{Contamination µgNaCl/in²} | | |
| 1 | IPCLCC | 100° F. | 5 | 5.9 | 2.5 | 8.4 |
| 2 | IPCLLC | 100° F. | 5 | 3.0 | 1.4 | 4.4 |
| 3 | IPCLLC | 100° F. | 5 | 4.0 | 0.5 | 4.5 |
| Avg | IPCLLC | 100° F. | 5 | 4.3 | 1.5 | 5.8 |
| 4 | IPCLLC | 145° F. | 5 | 1.4 | 2.3 | 3.7 |
| 5 | IPCLLC | 145° F. | 5 | 1.1 | 1.1 | 2.2 |
| 6 | IPCLLC | 145° F. | 5 | 4.6 | 0.0 | 4.6 |
| Avg | IPCLLC | 145° F. | 5 | 2.4 | 1.1 | 3.5 |
| 7 | PLCC68 | 100° F. | 5 | 0.8 | 0.8 | 1.6 |
| 8 | PLCC68 | 100° F. | 5 | 3.2 | 1.5 | 4.7 |
| 9 | PLCC68 | 100° F. | 5 | 0.0 | 2.0 | 2.0 |
| Avg | PLCC68 | 100° F. | 5 | 1.3 | 1.4 | 2.8 |
| 10 | PLCC68 | 145° F. | 5 | 0.6 | 0.0 | 0.6 |
| 11 | PLCC68 | 145° F. | 5 | 1.2 | 0.0 | 1.2 |
| 12 | PLCC68 | 145° F. | 5 | 2.9 | 0.0 | 2.9 |
| Avg | PLCC68 | 145° F. | 5 | 1.6 | 0.0 | 1.6 |

From Tables 2 and 3 it can clearly be seen that the cleaner of the present invention was superior relative to cleaning ability than water alone for both types of circuit assemblies and at the different wash times. Even elevating the temperature of the water as shown in Table 4 did not provide a level of cleaning that approached the level of cleaning obtained by the cleaner of the present invention.

EXAMPLE 3

The cleaner described below comprises a higher alkaline salt content than the cleaner of Example 1 but is considered within the scope of the present invention. The ingredients and amounts thereof are shown in Table 5.

TABLE 5

| Ingredient | Wt. % |
| --- | --- |
| Water | 81.61 |
| Potassium Bicarbonate | 10.00 |
| Potassium Carbonate | 4.00 |
| Acrylic acid copolymer[1] | 0.20 |
| Mag. Sulfate Heptahydrate | 0.34 |
| Monatrope 1250 | 2.75 |
| Olin CS-1 | 0.05 |
| Olin S505LF | 0.15 |
| Olin SL62 | 0.25 |
| BASF RA20 | 0.15 |
| BASF DW5 | 0.50 |

[1] A polycarboxylated copolymer containing acrylic and maleic acid units and having a molecular weight of about 4,500, Rhone Poulenc.

EXAMPLE 4

Printed circuit assemblies soldered with water soluble paste and washed with the formulation shown in Table 1, did not have the significant levels of white residues encountered when comparable assemblies were washed with water alone. This is demonstrated in the Table below:

TABLE 6

| Wash Conditions[a]: 5 minutes @ 100° F. | | |
| --- | --- | --- |
| Wash System | Water Sol. Paste | Appearance of Washed Assembly |
| Water | Kester 850WS | Lot of white residue on board |
| Ex. 1[b] | Kester 850WS | No visible white residue on board |
| Water | Delta 760WS | Lot of white residue on board |
| Ex. 1[b] | Delta 760WS | No visible white residue on board |
| Water | Alpha 601WS | Lot of white residue on board |
| Ex. 1[b] | Alpha 601WS | No visible white residue on board |

[a] Using an ECD (Electronics Control Design) Model 9300 Batch Washer
[b] Formula of Table 1 used at a 10% by volume concentration in water

EXAMPLE 5

Assemblies washed with the compositions described in this invention show important reductions in white residues over those obtained by the use of alkalinity alone. Table 7 below shows a comparison of (1) water alone, (2) a 10% aqueous solution of the Formula shown in Table 1 and (3) a 1% solution of sodium bicarbonate in the wash water.

TABLE 7

| Wash Conditions[a]: 5 minutes @ 100° F. | | |
| --- | --- | --- |
| Wash System | Water Sol. Paste | Appearance of Washed Assembly |
| Water | Kester 850WS | Lot of white residue |
| 1% Bicarb | Kester 850WS | Moderate amount of white residue |
| Ex. 1[b] | Kester 850WS | No white residue |

What is claimed is:

1. A cleaning composition for removing water-soluble flux residues from circuit assemblies comprises an aqueous concentrate containing a surfactant formulation, said surfactant formulation containing at least three nonionic surfactants which have cloud points of at least 95° F. in an aqueous solution of said cleaning composition and which cloud points are at least 5° F. different from each other.

2. The cleaning composition of claim 1 wherein the cloud points of each of the surfactants is 5°–25° F. different from the others.

3. The cleaning composition of claim 1 wherein said three nonionic surfactants include a first surfactant having a cloud point in said aqueous solution which falls within the range of 95°–120° F., a second surfactant having a cloud point in said aqueous solution which falls within the range of 110°–135° F. and a third surfactant having a cloud point in said aqueous solution which falls within the range of 125°–150° F., said second and third surfactants having cloud points at least 10° F. higher than said first and second surfactants, respectively.

4. The cleaning composition of claim 1 wherein said concentrate has a pH of from about 7–12.

5. The cleaning composition of claim 4 wherein said concentrate has a pH ranging from above 7 to 12.0.

6. The cleaning composition of claim 5 wherein said concentrate has a pH of from about 8.5–9.5.

7. The cleaning composition of claim 1 wherein said concentrate further contains an alkalinity providing agent in the form of alkaline salts.

8. The cleaning composition of claim 7 wherein said alkaline salts comprise alkali metal carbonates, alkali metal bicarbonates or mixtures thereof.

9. The cleaning composition of claim 8 wherein said alkaline salts comprise a mixture of potassium carbonate and potassium bicarbonate.

10. The cleaning composition of claim 1 wherein said aqueous concentrate further contains a corrosion inhibitor.

11. The cleaning composition of claim 10 wherein said corrosion inhibitor comprises magnesium ions.

12. The cleaning composition of claim 11 wherein said magnesium ions are in the form of a magnesium salt.

13. The cleaning composition of claim 12 wherein said magnesium salt comprises magnesium sulfate.

14. The cleaning composition of claim 13 wherein said concentrate further includes a carboxylated polymeric stabilizer to maintain said magnesium sulfate in aqueous solution.

15. The cleaning composition of claim 1 wherein said nonionic surfactants comprise alkoxylated alcohols.

16. The cleaning composition of claim 1 wherein said concentrate further contains an alkalinity providing agent, a corrosion inhibitor and a hydrotrope to maintain said surfactants in aqueous solution.

17. The cleaning composition of claim 16 wherein said hydrotrope comprises an alkali metal salt of a $C_7$–$C_{13}$ linear carboxylic acid.

18. The cleaning composition of claim 16 wherein said corrosion inhibitor comprises magnesium sulfate and said concentrate further contains a carboxylated polymer to maintain said magnesium sulfate in aqueous solution.

19. The cleaning composition of claim 18 wherein said concentrate further contains an anionic surfactant.

20. The cleaning composition of claim 19 wherein said carboxylated polymer comprises an acrylic acid homopolymer, maleic acid homopolymer or an acrylic/maleic acid copolymer.

21. A method of removing water soluble flux residues from circuit assemblies comprises contacting said circuit assemblies with an aqueous solution containing at least three nonionic surfactants, said surfactants having cloud points of at least 95° F. in said aqueous solution and which cloud points are at least 5° F. different from each other.

22. The method of claim 21 wherein said circuit assemblies are contacted with said aqueous solution at a temperature ranging from 90° F. to 150° F.

23. The method of claim 22 wherein said nonionic surfactants include a first surfactant having a cloud point in said aqueous solution which falls within the range of 95°–120° F. a second surfactant having a cloud point in said aqueous solution which falls within the range of 110°–135° F. and a third surfactant having a cloud point in said aqueous solution which falls within the range of 125°–150° F., said second and third surfactants having cloud points at least 10° F. higher than said first and second surfactants, respectively.

24. The method of claim 21 wherein said surfactants comprise alkoxylated alcohols.

25. The method of claim 21 wherein said aqueous solution has a pH ranging from about 7–12.

26. The method of claim 25 wherein said aqueous solution has a pH ranging from above 7 to 12.

27. The method of claim 26 wherein said aqueous solution has a pH ranging from about 8.5–9.5.

28. The method of claim 21 wherein said aqueous solution further contains an alkalinity providing agent.

29. The method of claim 28 wherein said alkalinity providing agent is in the form of one or more alkaline salts.

30. The method of claim 29 wherein said one or more alkaline salts comprise alkali metal carbonates, alkali metal bicarbonates or mixtures thereof.

31. The method of claim 29 wherein said aqueous solution further includes a corrosion inhibitor in the form of magnesium ions.

32. The method of claim 31 wherein said magnesium ions are in the form of magnesium sulfate.

33. The method of claim 31 wherein said aqueous solution includes a hydrotrope to maintain said surfactants in aqueous solution.

34. The method of claim 33 wherein said hydrotrope comprises an alkali metal salt of a $C_7$–$C_{13}$ linear monocarboxylic acid.

35. The method of claim 33 wherein said aqueous solution further includes a carboxylated polymer to maintain said magnesium ion corrosion inhibitor in aqueous solution.

36. The method of claim 35 wherein said carboxylated polymer comprises an acrylic acid homopolymer, maleic acid homopolymer or an acrylic/maleic acid copolymer.

37. The method of claim 35 wherein said aqueous solution further contains an anionic surfactant.

38. The method of claim 37 wherein said aqueous solution further contains a defoamer other than said nonionic surfactants.

39. The method of claim 21 wherein circuit assemblies are contacted with said aqueous solution by immersing said assemblies in said aqueous solution.

40. The method of claim 21 wherein said circuit assemblies are contacted with said aqueous solution by spraying said aqueous solution on said circuit assemblies.

41. A surfactant formulation capable of providing optimum cleaning performance over a broadened temperature range comprises at least three nonionic surfactants which have cloud points of at least 95° F. in an aqueous solution containing said formulation and which cloud points are at least 5° F. different from each other.

42. The surfactant formulation of claim 41 wherein the cloud points of each of said surfactants differ by a range of from 10°–30° F. from each other.

43. The surfactant formulation of claim 41 comprising a first surfactant having a cloud point in said aqueous solution which falls within the range of 95°–120° F., a second surfactant having a cloud point in said aqueous solution which falls within the range of 110°–135° F. and a third surfactant having a cloud point in said aqueous solution which falls within the range of 125°–150° F. wherein the cloud points of said second and third surfactants are at least 10° F. higher than cloud points of said first and second surfactants, respectively.

44. The surfactant formulation of claim 41 wherein said nonionic surfactants comprise alkoxylated alcohols.

45. The cleaning composition of claim 1 wherein said at least three nonionic surfactants comprise 0.2 to 1.5 wt.% relative to said concentrate.

46. The cleaning composition of claim 7 wherein said at least three nonionic surfactants comprise 0.2 to 1.5 wt.% and said alkaline salts comprise 1 to 15 wt.% relative to said concentrate.

47. The cleaning composition of claim 46 wherein said alkaline salts comprise 1 to 3 wt.% relative to said concentrate.

48. The method of claim 21 wherein said at least three nonionic surfactants comprise 0.2 to 1.5 wt.% relative to said concentrate.

49. The method of claim 30 wherein said at least three nonionic surfactants comprise 0.2 to 1.5 wt.% and said alkaline salts comprise 1 to 15 wt.% relative to said concentrate.

50. The method of claim 49 wherein said alkaline salts comprise 1 to 3 wt.% relative to said concentrate.

\* \* \* \* \*